(12) United States Patent
Acklin et al.

(10) Patent No.: US 6,818,470 B1
(45) Date of Patent: Nov. 16, 2004

(54) PROCESS FOR PRODUCING A THERMOELECTRIC CONVERTER

(75) Inventors: Bruno Acklin, Regensburg (DE); Karl-Heinz Schlereth, Burglengenfeld (DE); Harald Boettner, Freiburg (DE); Axel Schubert, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/806,424

(22) PCT Filed: Mar. 29, 1999

(86) PCT No.: PCT/DE99/03136

§ 371 (c)(1),
(2), (4) Date: Jul. 24, 2001

(87) PCT Pub. No.: WO00/19548

PCT Pub. Date: Apr. 6, 2000

(30) Foreign Application Priority Data

Sep. 30, 1998 (DE) .......................................... 198 45 104

(51) Int. Cl.[7] ............................................... H01L 27/16
(52) U.S. Cl. .......................... 438/55; 438/107; 438/455
(58) Field of Search ............................ 438/54, 55, 107, 438/455, FOR 136; 148/DIG. 12

(56) References Cited

U.S. PATENT DOCUMENTS

| 3,781,176 A | * | 12/1973 | Penn et al. | .................. | 136/201 |
| 5,824,561 A | * | 10/1998 | Kishi et al. | .................. | 438/106 |
| 6,329,217 B1 | * | 12/2001 | Watanabe et al. | ........... | 136/203 |

FOREIGN PATENT DOCUMENTS

| DE | 39 35 610 A1 | 10/1989 | .......... H01L/35/32 |
| EP | 0 482 215 A1 | 4/1992 | .......... H01L/35/34 |
| EP | 0 506 093 A1 | 9/1992 | .......... H01L/37/00 |
| GB | 2 119 170 | 4/1983 | .......... H01L/35/00 |
| JP | 09051125 | 2/1997 | .......... H01L/35/32 |

* cited by examiner

*Primary Examiner*—George Fourson
(74) *Attorney, Agent, or Firm*—Peter F. Corless; Steven M. Jensen; Edwards & Angell, LLP

(57) ABSTRACT

Method for fabricating a thermoelectric converter having a plurality of series-connected thermoelement cells, which are connected in series with one another by means of a plurality of first electrical conductor tracks (3) and each of which has a first body (4) made of thermoelectric material of a first conduction type and a second body (5) made of thermoelectric material of a second conduction type. The thermoelement cells are fabricated by means of method steps appertaining to semiconductor technology.

9 Claims, 7 Drawing Sheets

Figure 2A:
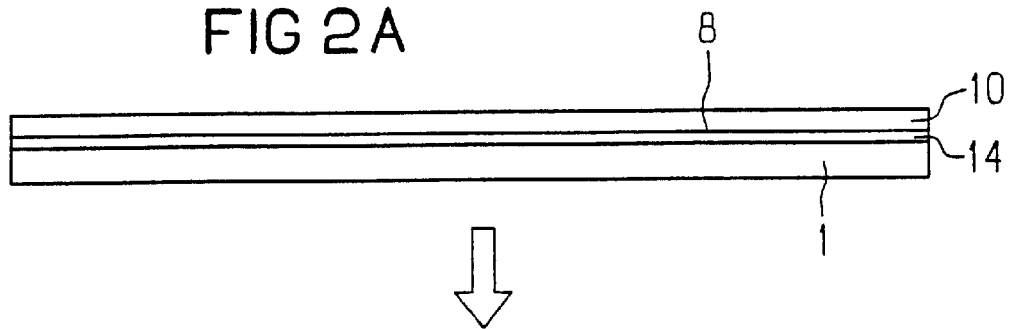

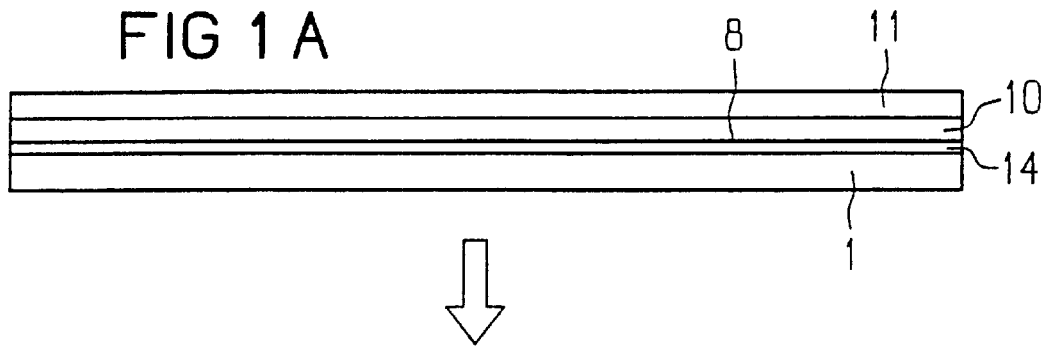
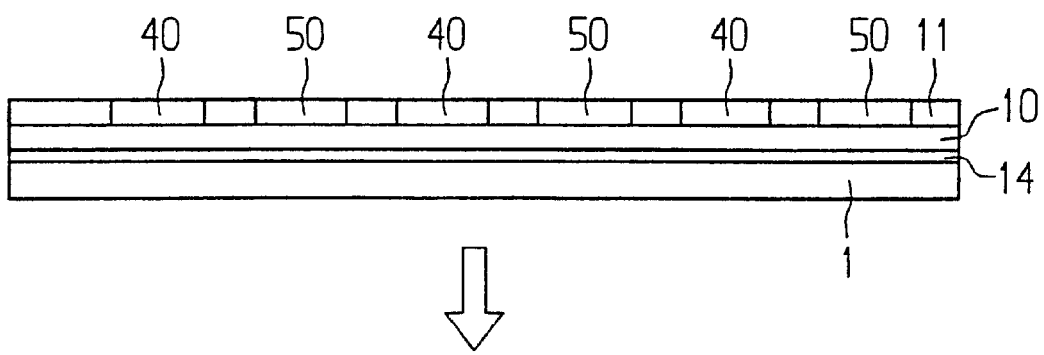
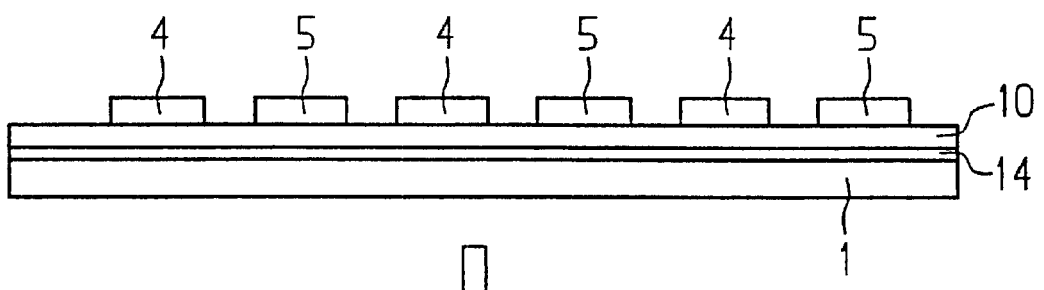
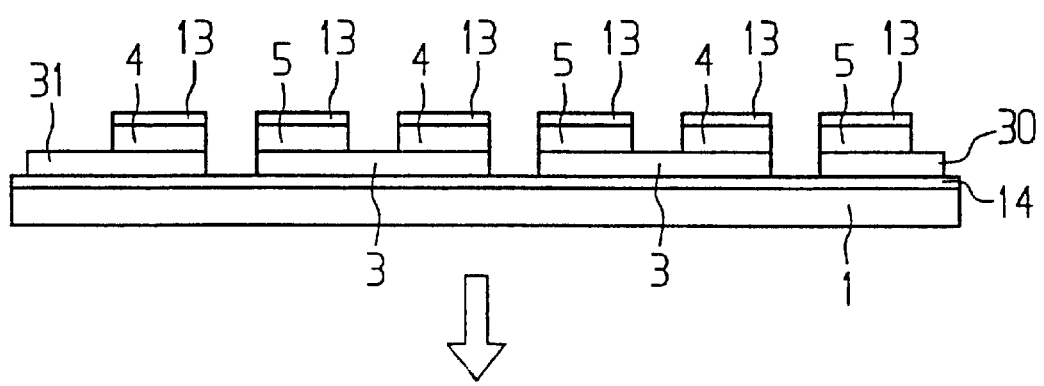

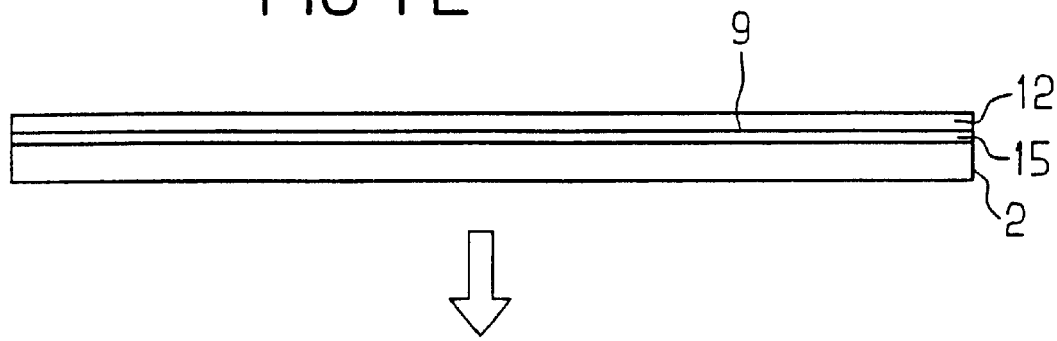
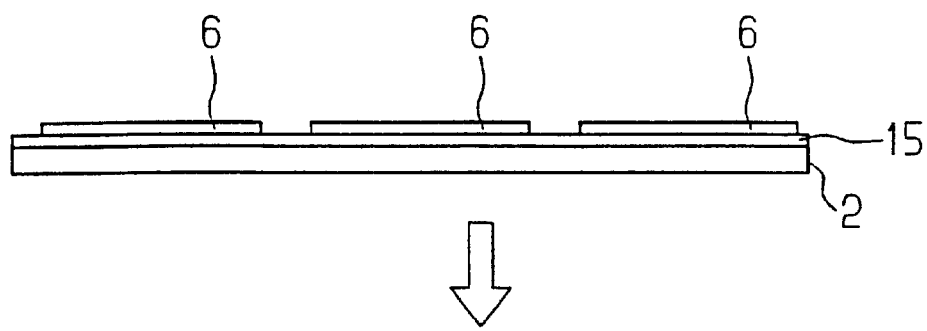
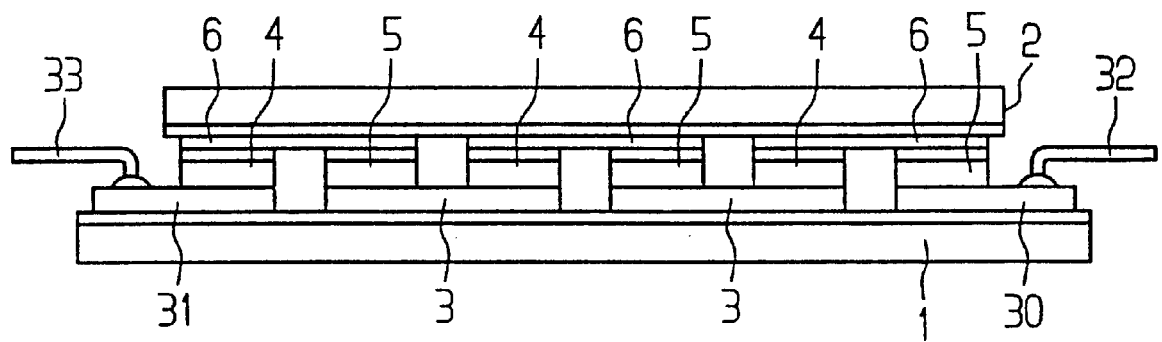

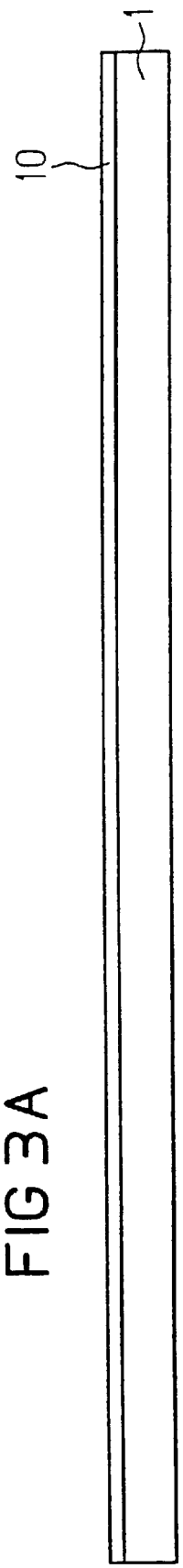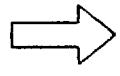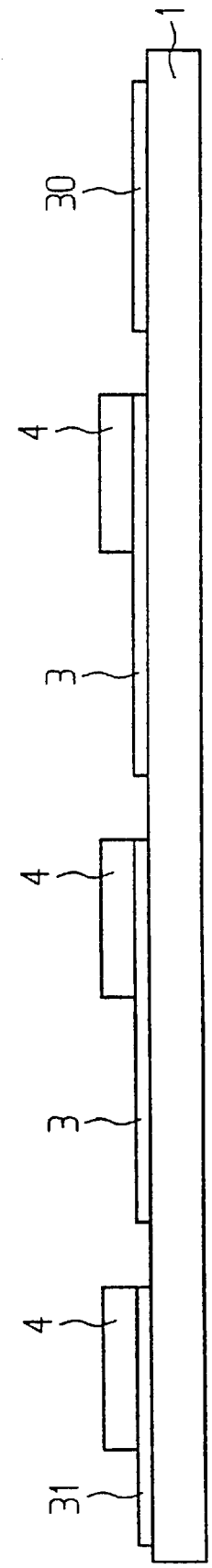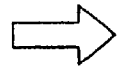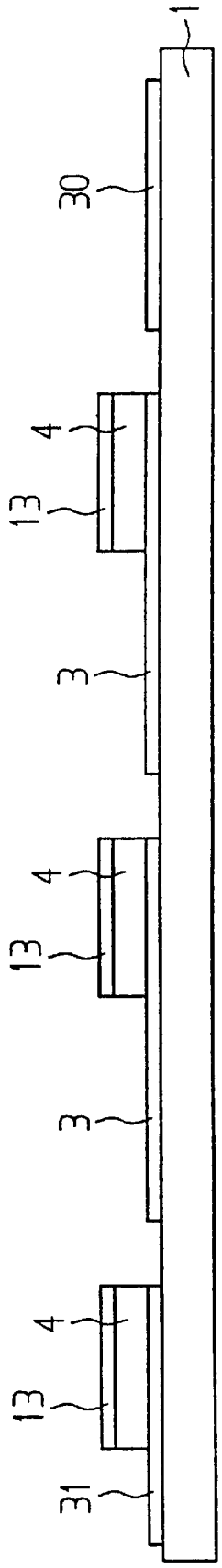

↓

PROCESS FOR PRODUCING A THERMOELECTRIC CONVERTER

The invention relates to a method for fabricating a thermoelectric converter.

DE 39 35 610 A1 describes a Peltier cooler having an interconnection of n- and p-doped semiconductor segments which are connected together with the aid of metal bridges. In this case, the metal bridges are applied on $Al_2O_3$ substrates and the semiconductor segments in the case of one of these substrates are vapor-deposited onto the metal bridges present there. Peltier coolers of this type have a physical size in the centimeters range and cannot readily be miniaturized, with the result that the power density is very low. Furthermore, the $Al_2O_3$ substrates have a very low thermal conductivity, which impairs the effectiveness of such Peltier coolers.

The object of the present invention consists in developing a method for fabricating a thermoelectric converter of the type mentioned in the introduction which allows a higher integration level of the thermoelement cells and thereby enables the fabrication of thermoelectric components with a higher power density and in which cost-effective processes are used.

This object is achieved by means of a method having the features of claim 1. Subclaims 2 to 10 relate to advantageous developments of the method.

The method according to the invention is used to fabricate a thermoelectric converter having a plurality of series-connected thermoelement cells, which are connected in series with one another by means of a plurality of first electrical conductor tracks and each of which has a first body made of thermoelectric material of a first conduction type and a second body made of thermoelectric material of a second conduction type, which are connected to one another by means of a second electrical conductor track and which are arranged in a sandwich-like manner between a first and a second substrate wafer which is electrically insulating or has an electrically insulating layer.

In the method, the first electrical conductor tracks are formed on a main area of the first substrate wafer. The second electrical conductor tracks are produced on a main area of the second substrate wafer. In the case of at least one of the two substrate wafers, at least one layer made of thermoelectric material is applied on the same side on which the conductor tracks are produced. Said layer is patterned by means of photomask technology and etching in such a way that the first and second bodies of the thermoelement cells are produced.

After the processing of the two substrate wafers, the latter are joined together e.g. by means of thermocompression, soldering, adhesive bonding or anodic bonding to form a sandwich composite, in which the first and the second bodies are arranged between the two substrate wafers and are connected by means of the first and second electrical conductor tracks to form thermoelement cells connected in series.

In each case a first and a second body are connected on a first side by means of a first conductor track to form a thermoelement cell, which are connected in series with one another by means of the second conductor tracks on a second side—opposite to the first side—of the first and second bodies.

In a preferred embodiment for producing the first and second conductor tracks and the first and second bodies, firstly a first electrically conductive layer is applied to the main area of the first substrate wafer. A layer made of thermoelectric material is subsequently deposited onto said electrically conductive layer and a plurality of doped regions of the first conduction type and a plurality of doped regions of the second conduction type are then formed in said layer made of thermoelectric material.

The layer made of thermoelectric material is subsequently patterned by means of photomask technology and etching to form first and second bodies; i.e., after the patterning mutually isolated first and second bodies remain on the first electrically conductive layer.

After this process step, the first electrically conductive layer is patterned for example once again by means of photomask technology and etching to form first conductor tracks which each connect a first and a second body to one another on one side of the bodies, thereby producing a plurality of mutually isolated thermoelement cells.

However, the first electrically conductive layer can also be patterned to form first conductor tracks even before the application of the layer made of thermoelectric material.

Before, during or after these steps, a second electrically conductive layer is applied to the main area of the second substrate wafer and is subsequently patterned, for example, once again by means of photomask technology and etching to form second conductor tracks which connect the thermoelement cells in series with one another in the sandwich composite.

The two wafers are joined together to form the sandwich composite in the manner already specified further above.

In another preferred embodiment for producing the first and second conductor tracks and the first and second bodies, a first electrically conductive layer is applied to the main area of the first substrate wafer. That is followed by application of a first layer made of thermoelectric material, which is of the first conduction type, to the first electrically conductive layer.

This first layer made of thermoelectric material is subsequently patterned by means of photomask technology and etching in such a way that a plurality of mutually isolated first bodies are produced on the first electrically conductive layer.

After this process step, the first electrically conductive layer is patterned for example once again by means of photomask technology and etching to form first conductor tracks.

In this case, too, the first electrically conductive layer can, however, also be patterned to form first conductor tracks even before the application of the first layer made of thermoelectric material.

Before, during, or after these process steps, a second electrically conductive layer is applied to the main area of the second substrate wafer and a second layer made of thermoelectric material, which is of the second conduction type, is deposited on said second electrically conductive layer.

This second layer made of thermoelectric material is then patterned by means of photomask technology and etching in such a way that a plurality of mutually isolated second bodies are produced on the second electrically conductive layer.

The second electrically conductive layer is subsequently patterned to form second conductor tracks for example once again by means of photomask technology and etching.

The second electrically conductive layer can also be patterned to form second conductor tracks even before the application of the second layer made of thermoelectric material.

The two wafers are joined together to form a sandwich composite with thermoelement cells connected in series in the manner already specified further above.

In a further preferred embodiment for producing the first and second conductor tracks and the first and second bodies, a first electrically conductive layer is again applied to the main area of the first substrate wafer. That is followed by application of a first layer made of thermoelectric material, which is of the first conduction type, to the first electrically conductive layer.

A first layer made of thermoelectric material, which is of the first conduction type, is then deposited onto said first electrically conductive layer. This first layer is subsequently patterned by means of photomask technology and etching in such a way that a plurality of first bodies are produced on the first electrically conductive layer.

A second layer made of thermoelectric material, which is of the second conduction type, is then applied to these first bodies and to the free surface—lying between the first bodies—of the first electrically conductive layer. This second layer is subsequently patterned once again by means of photomask technology and etching in such a way that a plurality of second bodies are produced on the free surface of the first electrically conductive layer.

The first electrically conductive layer can be patterned to form first conductor tracks before or after the application of the first and second layer made of thermoelectric material.

Before, during or after these process steps, a second electrically conductive layer is applied to the main area of the second substrate wafer and is subsequently patterned to form second conductor tracks.

The two wafers are joined together to form a sandwich composite with thermoelement cells connected in series in this case once again in the manner already specified further above.

The particular advantage of the abovementioned methods is that processes of semiconductor technology can be used for fabricating the first and second conductor tracks and the first and second bodies. As a result, both the integration level of the thermoelement cells and the fabrication costs for thermoelectric converters can be considerably reduced. This last is due to the fact that conventional and established processes of semiconductor technology which are used for the mass production of semiconductor chips are employed.

The thermoelectric converters fabricated by the method according to the invention can advantageously be integrated in a simple manner together with elements of microelectronics and/or microsystems technology on one and the same chip.

With the method according to the invention, the first and the second bodies can be fabricated in a simple manner from multilayer systems comprising a multiplicity of thin layers having a different material composition. As a result, the performance of thermoelectric converters can advantageously be increased by the use of layer sequences that are exactly coordinated with one another.

Figure 4A:
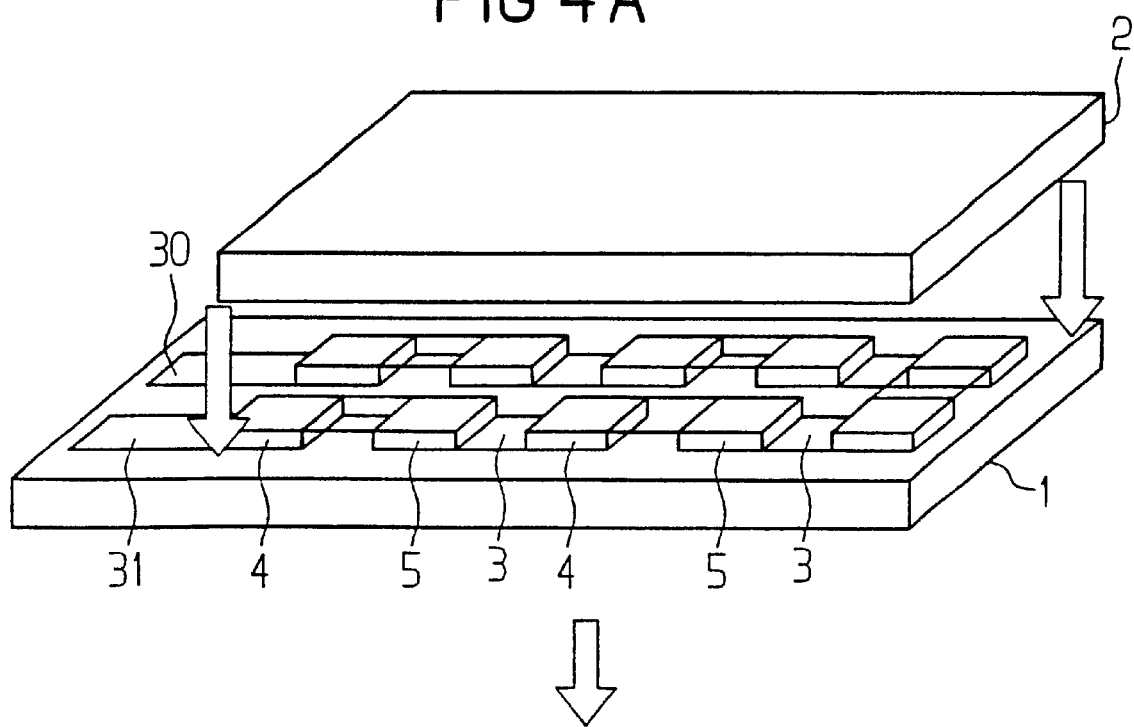
Figure 4B:
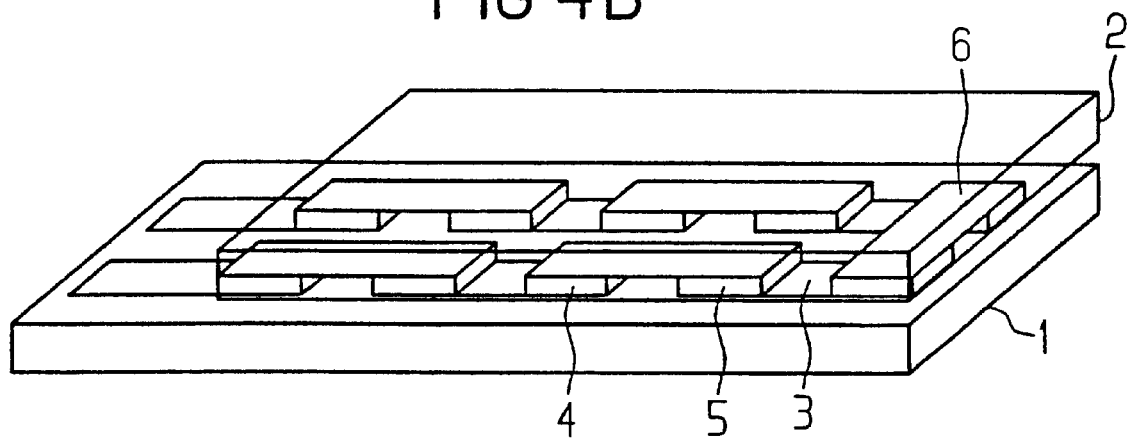

Three exemplary embodiments of the invention are explained below in conjunction with FIGS. 1a to 4c, in which:

FIGS. 1a to 1g show a diagrammatic illustration of the method sequence in accordance with a first exemplary embodiment, FIGS. 2a to 2g show a diagrammatic illustration of the method sequence in accordance with a second exemplary embodiment, FIGS. 3a to 3g show a diagrammatic illustration of the method sequence in accordance with a third exemplary embodiment, and FIGS. 4a to 4b show three-dimensional illustrations of a thermoelectric converter fabricated according to one of the exemplary embodiments.

In the figures, identical or identically acting constituents are each provided with the same reference symbols.

In the exemplary embodiment illustrated in FIGS. 1a to 1g, firstly a first electrically conductive layer 10 is fabricated on a main area 8 of a first substrate wafer 1. Said layer comprises e.g. a metal layer, a metal layer sequence or a highly doped and hence highly conductive semiconductor layer (e.g. diffused silicon).

The first substrate wafer 1 has overall a low electrical conductivity and is composed, for example, of semi-insulating silicon or has an electrically insulating layer 14 (e.g. an Si oxide or Si nitride layer) on the side of the main area 8.

On the first electrically conductive layer 10 there is deposited a layer 11 made of thermoelectric material (e.g. $Bi_2Te_3$, $Bi_2Se_3$, PbTe, Si, Ge, etc.) (FIG. 1a), in which a plurality of doped regions 40 of a first conduction type (e.g. p-conducting) and a plurality of doped regions 50 of a second conduction type (n-conducting) are subsequently formed by means of photomask technology and diffusion (FIG. 1b).

The layer 11 with the doped regions 40, 50 is then patterned to form first 4 and second bodies 5 by means of one or more conventional photomask and etching processes known from semiconductor technology (FIG. 1c).

Afterwards, the first electrically conductive layer 10 is likewise patterned by means of photomask technology and etching in such a way that a plurality of mutually isolated thermoelement cells are produced on the first substrate wafer 1, which cells each have a first body 4 and second body 5 and a first electrical conductor track 3 connecting said bodies (FIG. 1d).

As an alternative to the procedure described above, the first electrically conductive layer 10 can also be patterned prior to the application of the layer 11 made of thermoelectric material.

Furthermore, a metallization layer 13, composed e.g. of a solder (e.g. AuSn) or of gold, is in each case applied to those sides of the first and second bodies 4, 5 which are opposite to the first conductor track 3 (FIG. 1d).

Before, during or after this first wafer process, a second electrically conductive layer 12 is formed (FIG. 1e) on a main area 9 of a second substrate wafer 2 and patterned (FIG. 1f) to form second electrical conductor tracks 6.

Analogously to the substrate wafer 1, the second substrate wafer 2 has overall a low electrical conductivity and is composed, for example, of semi-insulating silicon or the substrate wafer 2 has an electrically insulating layer 15 (e.g. an Si oxide or Si nitride layer) on the side of the main area 9.

After the patterning of the second conductor tracks 6, the second substrate wafer 2 is placed with the latter onto the metallization layers 13 of the first and second bodies 4, 5 and aligned in such a way that the second conductor tracks 6 bear on the metallization layers 13 of the first and second bodies 4, 5 and connect the previously formed pairs comprising respectively a first and a second body 4, 5 in series with one another (FIG. 1g).

The second electrical conductor tracks 6 and the metallization layers 13 are subsequently connected to one another, for example by means of soldering, adhesive bonding or thermocompression.

This sandwich composite comprising the two substrate wafers 1, 2 and the intervening thermoelement cells is then separated to form a plurality of thermoelectric converters, e.g. by sawing. A plurality of different or identical thermoelectric converters can be produced from a sandwich composite. The respective first and last thermoelement cell of a series circuit of thermoelement cells of a thermoelectric converter each has an electrical pad 30, 31, via which the thermoelectric converter can be electrically connected, for example by means of bonding wires 32, 33.

However, the thermoelectric converters can also readily be embodied as SMD (Surface Mount Device) components, by the electrical pads 30, 31 being routed in an electrically conductive manner to that side of the first substrate wafer 1 which is opposite to the main area 8.

An advantageous process in the separation of the sandwich composite is a two-part sawing process in which one of the two substrate wafers 1, 2 is made smaller than the other. This facilitates the electrical connection of the thermoelectric converter (cf. FIG. 1g).

As an alternative to the above-described method (whole-area coating of the substrate wafers and subsequent patterning), the conductor tracks 3, 6 can be fabricated in a directly patterned manner by means of masking and metallization or diffusion of dopant into the respective substrate wafer 1, 2.

Figure 2B:
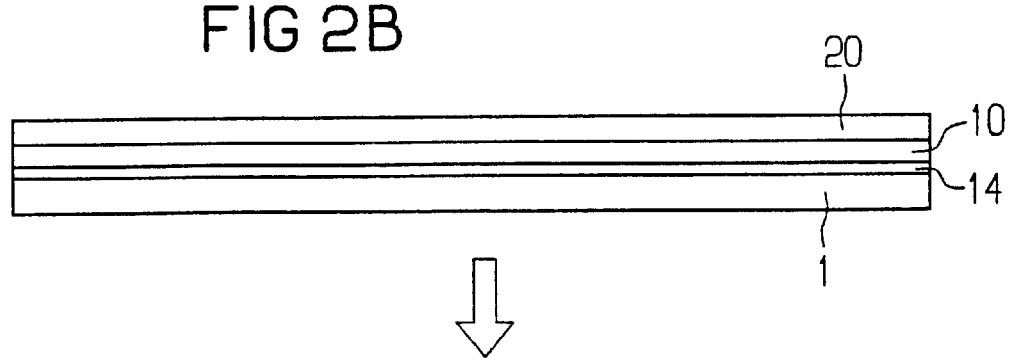
Figure 2C:
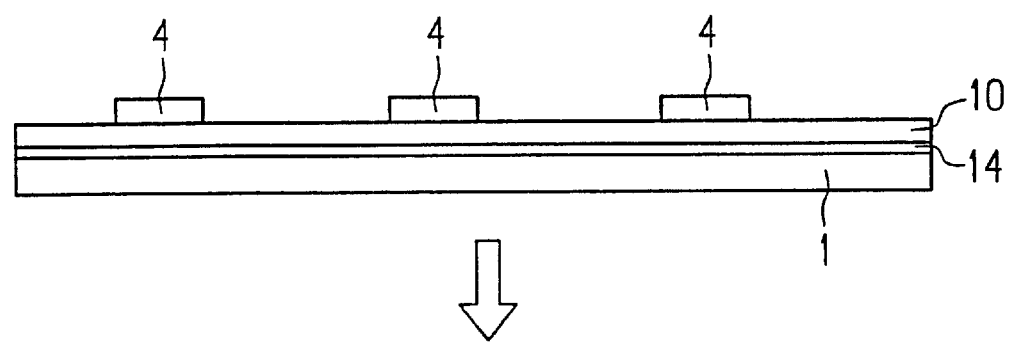
Figure 2D:
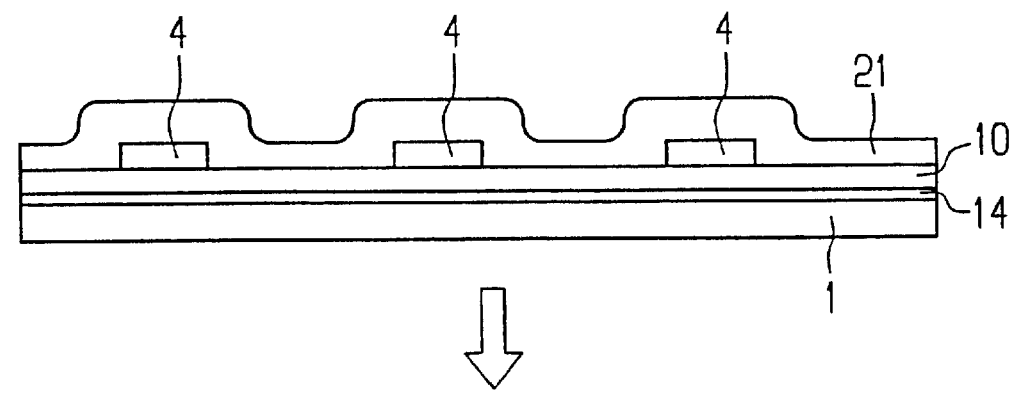
Figure 2E:
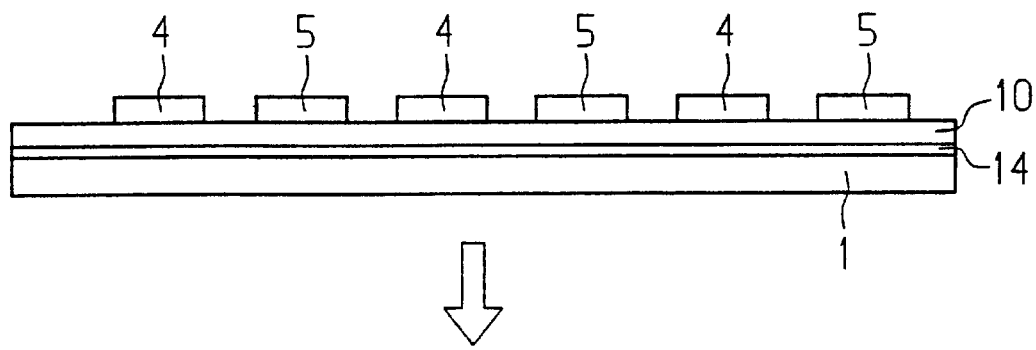

The exemplary embodiment illustrated in FIGS. 2a to 2g differs from that mentioned above essentially by the fact that the following methods are carried out in order to fabricate the first 4 and second bodies 5:

after the formation of the first electrically conductive layer 10, a first layer 20 made of thermoelectric material, which has the first conduction type, is deposited onto said first electrically conductive layer (FIGS. 2a and 2b);

the first layer 20 is patterned by means of photomask technology and etching in such a way that a plurality of mutually isolated bodies 4 are produced on the first electrically conductive layer 10 (FIG. 2c);

a second layer made of thermoelectric material 21, which has the second conduction type, is applied to that surface of the first electrically conductive layer 10 which is uncovered after the patterning of the first layer 20 between the first bodies 4, and to the first bodies 4 (FIG. 2d); and the second layer made of thermoelectric material 21 is patterned by means of photomask technology and etching in such a way that a plurality of second bodies 5 are produced on the first electrical layer 10 between the first bodies 4 (FIG. 2e).

The first electrically conductive layer 10 can be patterned to form first electrical conductor tracks 3 before or after the application of the first 20 and second layer 21 made of thermoelectric material.

Figure 2F:
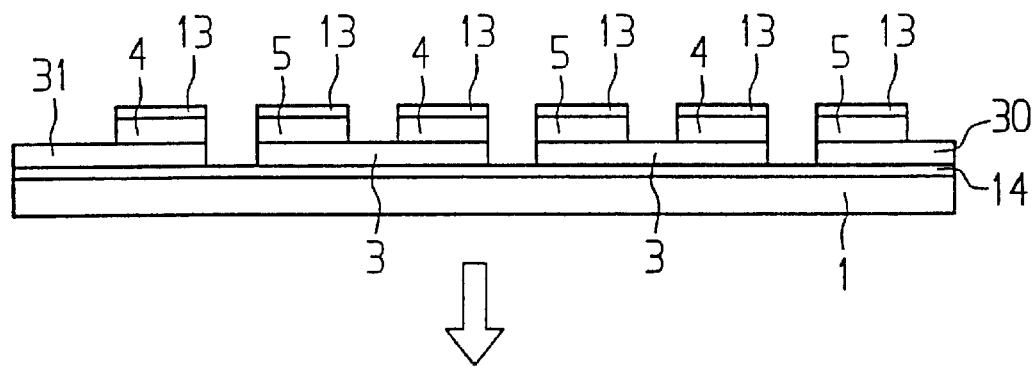
Figure 2G:
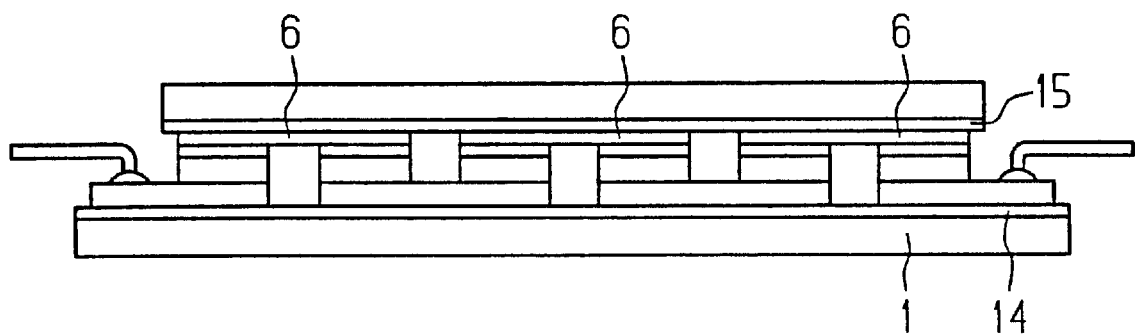
Figure 3D:
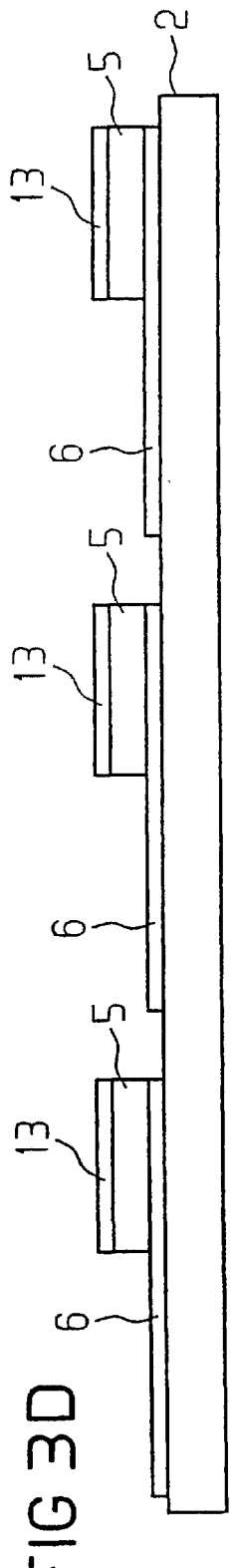
Figure 3E:
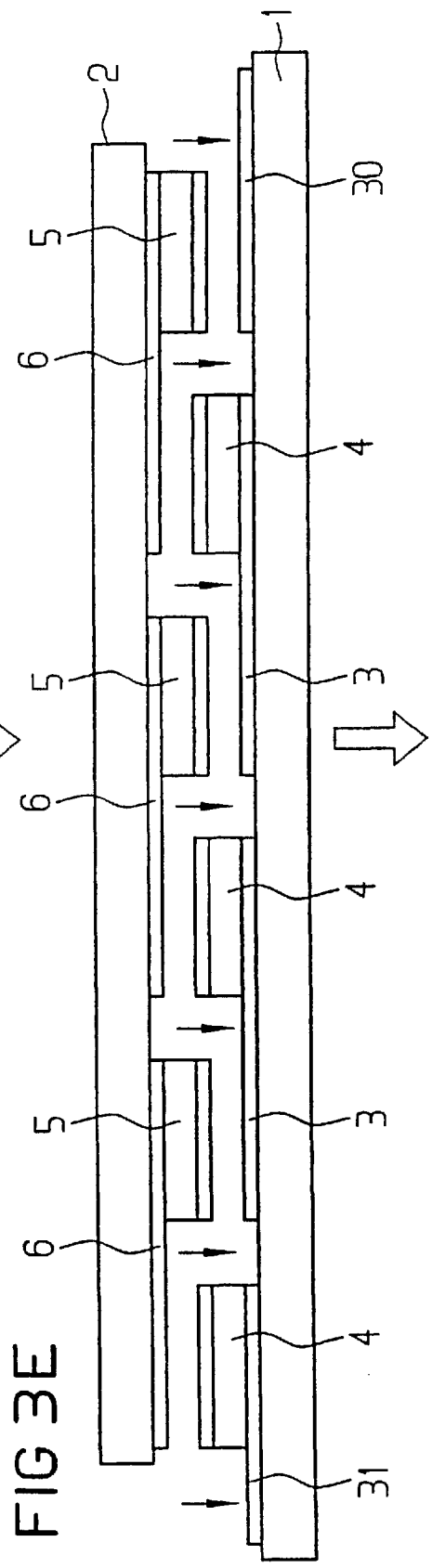
Figure 3F:
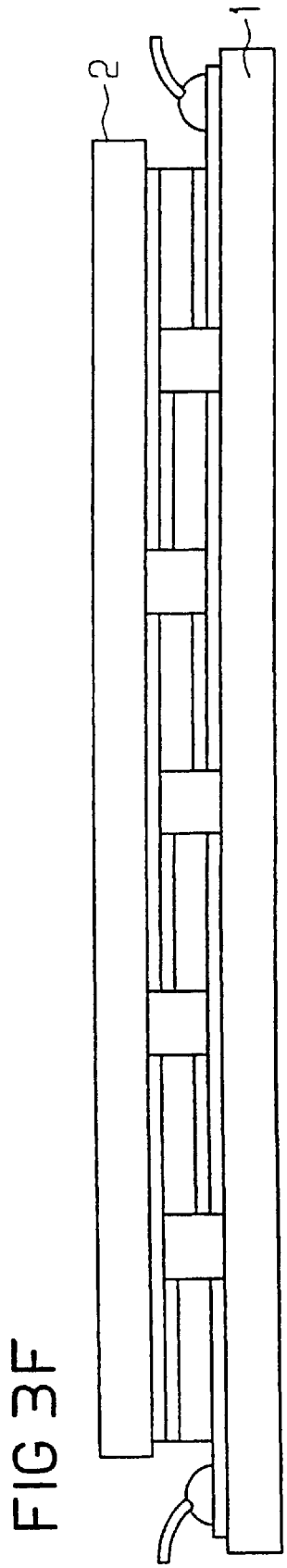

The fabrication of the second substrate wafer 2 with the second electrical conductor tracks 6 and the connection of the two wafers are effected analogously to the first exemplary embodiment (FIGS. 2f and 2g).

In the exemplary embodiment illustrated in FIGS. 3a to 3f, the method for fabricating the first and second bodies 4, 5 differs from that of FIGS. 2a to 2e essentially by the fact that the second layer 21 made of thermoelectric material, which has the second conduction type, is not deposited on the first substrate wafer 1. In this case, after the formation of the second electrically conductive layer 12 on the main area 9 of the second substrate wafer 2, the second layer made of thermoelectric material 21 is deposited thereon and subsequently patterned by means of photomask technology and etching in such a way that the second bodies 5 are produced on the second electrically conductive layer 12.

In the exemplary embodiments of FIGS. 1a to 1g and of FIGS. 3a to 3e, as an alternative to the method by means of deposition, the layer 11 made of thermoelectric material or the first 20 and second layer 21 made of thermoelectric material can be fabricated as wafers which are connected to the first substrate wafer 1 or respectively to the first 1 and respectively the second substrate wafer 2 by means of wafer bonding. Tungsten silicide can be used as boding and metallization material (for the electrical conductor tracks).

FIGS. 4a and 4b show three-dimensional illustrations of a thermoelectric converter fabricated according to one of the methods described above. FIG. 4a is an exploded illustration and in FIG. 4b the second substrate wafer 2 is shown transparent.

In the exemplary embodiments described above, the thickness of the substrate wafers 1, 2 is advantageously 100–300 $\mu$m. The thickness of the layers 11, 20, 21 made of thermoelectric material is preferably approximately 50 $\mu$m. The thickness of the electrically conductive layers 10, 12 is about 1 $\mu$m.

What is claimed is:

1. A method for fabricating a thermoelectric converter having a plurality of series-connected thermoelement cells, each of which has a first body made of thermoelectric material of a first conduction type that is connected by a first electrical conductor track to a second body made of thermoelectric material of a second conduction type, where the thermoelement cells are connected to one another in series by a second electrical conductor track and are arranged in a sandwich-like manner between a first substrate wafer and a second substrate wafer, the method comprising:

forming a first electrically conductive layer on a main area of the first substrate wafer;

applying a first layer made of thermoelectric material, which is of the first conduction type, to the first electrically conductive layer;

patterning the first layer made of thermoelectric material to form the first bodies;

patterning the first electrically conductive layer to form the first conductor tracks;

forming a second electrically conductive layer on a main area of the second substrate wafer;

applying a second layer made of thermoelectric material which is of the second conduction type to the second electrically conductive layer;

patterning the second layer made of thermoelectric material to form the second bodies;

patterning the second electrically conductive layer to form the second conductor tracks; and connecting the first substrate wafer and the second substrate wafer such that the first and second electrical conductor tracks and the first and second bodies are arranged between the first and second substrate wafers to form the plurality of series-connected thermoelement cells.

2. The method as claimed in claim 1, in which, prior to the application of the second layer made of thermoelectric material, the second electrically conductive layer is patterned to form second conductor tracks.

3. The method as claimed in claim 1, in which, prior to the application of the first layer made of thermoelectric material, the first electrically conductive layer is patterned to form first conductor tracks.

4. The method as claimed in claim 1, in which, prior to the application of the first layer made of thermoelectric material, the first electrically conductive layer is patterned to form first conductor tracks and, prior to the application of the second layer made of thermoelectric material, the second electrically conductive layer is patterned to form second conductor tracks.

5. The method as claimed in claim 1, in which the first layer and the second layer made of thermoelectric material are fabricated as wafers which are connected to the first substrate wafer and the second substrate wafer, respectively, by means of wafer bonding.

6. The method as claimed in claim 1, in which Si wafers are used as the substrate wafers.

7. The method as claimed in claim 1, in which the first and the second bodies are fabricated from multilayer systems comprising a multiplicity of layers having a different material composition.

8. The method as claimed in claim 1, in which electrically insulating wafers are used as the substrate wafers.

9. The method as claimed in claim 1, in which wafers having an electrically insulating layer are used as the substrate wafers.

* * * * *

UNITED STATES PATENT AND TRADEMARK OFFICE
CERTIFICATE OF CORRECTION

PATENT NO.     : 6,818,470 B1
DATED          : November 16, 2004
INVENTOR(S)    : Bruno Acklin et al.

It is certified that error appears in the above-identified patent and that said Letters Patent is hereby corrected as shown below:

Title page,
Item [22], PCT Filing Date, "Mar. 29, 1999" should read -- Sep. 29, 1999 --.

Signed and Sealed this

Twenty-third Day of August, 2005

JON W. DUDAS
*Director of the United States Patent and Trademark Office*